US012623220B2

(12) United States Patent  
Sarioglu et al.

(10) Patent No.: US 12,623,220 B2  
(45) Date of Patent: May 12, 2026

(54) CODE-MULTIPLEXED SENSOR NETWORKS FOR MICROFLUIDIC IMPEDANCE SPECTROSCOPY

(71) Applicant: Georgia Tech Research Corporation, Atlanta, GA (US)

(72) Inventors: Ali Fatih Sarioglu, Atlanta, GA (US); Ningquan Wang, Atlanta, GA (US)

(73) Assignee: GEORGIA TECH RESEARCH CORPORATION, Atlanta, GA (US)

( * ) Notice: Subject to any disclaimer, the term of this patent is extended or adjusted under 35 U.S.C. 154(b) by 916 days.

(21) Appl. No.: 17/292,273

(22) PCT Filed: Nov. 11, 2019

(86) PCT No.: PCT/US2019/060748  
§ 371 (c)(1),  
(2) Date: May 7, 2021

(87) PCT Pub. No.: WO2020/097604  
PCT Pub. Date: May 14, 2020

(65) Prior Publication Data  
US 2021/0404937 A1 Dec. 30, 2021

Related U.S. Application Data

(60) Provisional application No. 62/758,104, filed on Nov. 9, 2018, provisional application No. 62/758,052, filed  
(Continued)

(51) Int. Cl.  
*B01L 3/00* (2006.01)  
*B29C 33/38* (2006.01)  
(Continued)

(52) U.S. Cl.  
CPC ... *B01L 3/502761* (2013.01); *B01L 3/502707* (2013.01); *B01L 3/502715* (2013.01);  
(Continued)

(58) Field of Classification Search  
CPC ......... B01L 3/502761; B01L 3/502707; B01L 3/502715; B01L 3/502776;  
(Continued)

(56) References Cited

U.S. PATENT DOCUMENTS

2011/0279130 A1* 11/2011 Reccius ............... G01N 15/132  
324/649  
2014/0008307 A1 1/2014 Guldiken et al.  
(Continued)

FOREIGN PATENT DOCUMENTS

WO 2012/094642 A2 7/2012  
WO 2014/015333 A1 1/2014  
(Continued)

OTHER PUBLICATIONS

International Search Report mailed Mar. 12, 2020 for International Patent Application No. PCT/US2019/060748 (2 pages).  
(Continued)

*Primary Examiner* — Charles Capozzi  
*Assistant Examiner* — Jacqueline Brazin  
(74) *Attorney, Agent, or Firm* — Smith, Gambrell & Russell, LLP

(57) ABSTRACT

A microfluidic device for particle analysis, such as immunophenotyping, includes a plurality of microfluidic channels for the passage of a particle-laden fluid flow, a plurality of dedicated impedance sensors for generating impedance signals relative to each microfluidic sensor. The impedance sensors are CODES Coulter sensors, each having a distinct coded sequence for generating mutually orthogonal signals. The system uses a multi-frequency excitation signal for driving the Coulter sensors, such that the Coulter sensors generate multi-frequency impedance signals. The system outputs the multi-frequency signals of the plurality of impedance sensors as a single multi-frequency multiplexed  
(Continued)

signal, which is subsequently separated into a plurality of single-frequency multiplexed signals, which are then demodulated into single-frequency component signals corresponding to each of the Coulter sensors.

9 Claims, 5 Drawing Sheets

Related U.S. Application Data on Nov. 9, 2018, provisional application No. 62/758, 025, filed on Nov. 9, 2018.

(51) Int. Cl.

| | |
|---|---|
| *B29C 39/00* | (2006.01) |
| *B29C 39/42* | (2006.01) |
| *B29K 105/00* | (2006.01) |
| *C23C 14/04* | (2006.01) |
| *C23C 14/18* | (2006.01) |
| *G01N 15/10* | (2024.01) |
| *G01N 15/1404* | (2024.01) |
| *G03F 7/00* | (2006.01) |

(52) U.S. Cl.
CPC .... *B01L 3/502776* (2013.01); *B29C 33/3842* (2013.01); *B29C 39/006* (2013.01); *B29C 39/42* (2013.01); *C23C 14/042* (2013.01); *C23C 14/18* (2013.01); *G01N 15/1023* (2024.01); *G01N 15/1404* (2013.01); *G03F 7/0017* (2013.01); *B01L 2200/027* (2013.01); *B01L 2200/0652* (2013.01); *B01L 2200/12* (2013.01); *B01L 2200/16* (2013.01); *B01L 2300/0636* (2013.01); *B01L 2300/0819* (2013.01); *B01L 2300/0864* (2013.01); *B01L 2300/12* (2013.01); *B29K 2105/0002* (2013.01); *G01N 2015/1019* (2024.01)

(58) Field of Classification Search
CPC ....... B01L 2200/027; B01L 2200/0652; B01L 2200/12; B01L 2200/16; B01L 2300/0636; B01L 2300/0819; B01L 2300/0864; B01L 2300/12; B29C 33/3842; B29C 39/006; B29C 39/42; C23C 14/042; C23C 14/18; G01N 15/1023; G01N 15/1404; G01N 2015/1019; G01N 15/134; G01N 2015/1006; G01N 2015/1027; G03F 7/0017; B29K 2105/0002; C12M 23/16; C12M 41/36; B33Y 80/00
USPC ....................................................... 422/502
See application file for complete search history.

(56) References Cited

U.S. PATENT DOCUMENTS

| | | | |
|---|---|---|---|
| 2014/0236036 A1* | 8/2014 | de Haan .............. | A61B 5/1128 |
| | | | 600/534 |
| 2016/0075987 A1 | 3/2016 | Zhang et al. | |
| 2016/0238623 A1 | 8/2016 | Sun et al. | |
| 2016/0377567 A1* | 12/2016 | Lu .......................... | G01N 27/06 |
| | | | 324/693 |
| 2019/0271634 A1 | 9/2019 | Handique | |
| 2021/0394182 A1 | 12/2021 | Sarioglu et al. | |

FOREIGN PATENT DOCUMENTS

| | | | | |
|---|---|---|---|---|
| WO | WO-2017070602 A1 * | 4/2017 | ........ | B01L 3/502761 |
| WO | WO-2018077657 A1 * | 5/2018 | .............. | A61B 5/05 |

OTHER PUBLICATIONS

Written Opinion of the International Searching Authority mailed Mar. 12, 2020 for International Patent Application No. PCT/US2019/060748 (4 pages).

* cited by examiner $$x_1(t) = a_{11}s_1 + a_{12}s_2$$
$$x_2(t) = a_{21}s_1 + a_{22}s_2$$

CODE-MULTIPLEXED SENSOR NETWORKS FOR MICROFLUIDIC IMPEDANCE SPECTROSCOPY

STATEMENT REGARDING FEDERALLY FUNDED RESEARCH

The inventions herein were made with government support under grant no. ECCS 1752170, awarded by the National Science Foundation. The government has certain rights in the inventions.

FIELD OF THE INVENTION

The present invention relates to apparatuses and methods for flow cytometry. In particular, the present invention is directed to microfluidic sensor platforms and methods of using the same for quantifying physical and chemical properties of microfluidic particles.

BACKGROUND OF THE INVENTION

Recent developments in microfluidic sensors have made it possible to quantify the physical and chemical properties of individual particles in a particle-laden flow, such as the physical and chemical characteristics of cells in biological assays. In some approaches, a microfluidic particle flow is fed through a microfluidic channel having a micro-constriction that effectively limits the passage of individual particles one at a time, and a microfluidic sensor is used to detect an electrical conduction change within the micro-constriction when a particle passes therethrough. One such microfluidic sensor is a Coulter sensor, which implements resistive pulse sensing (RPS) technology. Coulter sensors are versatile instruments that have been used in analysis of blood cells, proteins, DNA molecules, viruses, and nanoparticles.

In the interest of increasing overall throughput of such microfluidic sensors, it has been proposed to construct a multi-sensor chip that provides for individualized particle flow through multiple parallel microfluidic channels, with a dedicated Coulter sensor allocated to each microfluidic channel. It has also been proposed that a multi-sensor chip may output a single multiplexed signal by driving each of the Coulter sensors with separate excitation signals, each having a distinct frequency. However, such approaches significantly increase the complexity of the device, and limit the scalability thereof, as the number of dedicated electrodes and circuits increases linearly with the number of microfluidic channels.

Despite the advances provided to date in the art, there remains a need for improvements to microfluidic sensors for yet further advancing the state of the art, and improving the overall throughput and accuracy of such devices and methods generally.

SUMMARY OF THE INVENTION

A microfluidic device for particle analysis includes a plurality of microfluidic channels for the passage of a particle-laden fluid flow, and a plurality of impedance sensors. Each of the plurality of impedance sensors is dedicated to a single microfluidic channel for outputting a signal representative of an impedance across the corresponding microfluidic channel, and each impedance sensor is provided with a coded sequence of opposing positive and negative electrode fingers, the coded sequences of the impedance sensors being distinct from one another. In some examples the impedance sensors may be coded such that output signals from the plurality of impedance sensors are mutually orthogonal to one another.

Each of the microfluidic channels comprises an inlet end, an outlet end, and a micro-constriction portion positioned between the input and outlet end, and the corresponding dedicated impedance sensor for each microfluidic channel is adapted to generate a signal representative of impedance at the micro-constriction portion of the corresponding microfluidic channel. The micro-constriction portion of each microfluidic channel is dimensioned to limit flow therethrough to a particle-by-particle flow.

A signal generator is provided for driving the impedance sensors with an excitation signal, the signal generator being adapted to output a multi-frequency excitation signal comprising multiple tones such that the impedance sensors generate multi-frequency signals representative of impedance across the microfluidic channels. The signal generator is adapted to generate multi-frequency signals having two, three, four, or more tones.

The microfluidic device comprises a sensor platform for outputting the signals generated by the impedance sensors, and circuitry for processing the output signal. The sensor platform is adapted to output the multi-frequency signals of the plurality of impedance sensors as a single multi-frequency multiplexed signal that comprises each of the coded (e.g., mutually orthogonal) output signals of the impedance sensors. First circuitry, such as a lock-in amplifier, is provided for separating the multi-frequency multiplexed signal into multiple multiplexed signals, with a separate multiplexed signal corresponding to each tone of the multi-frequency excitation signal. Second circuitry, such as a programmed processing unit, is provided for demodulating each of the single-frequency multiplexed signals to extract single-frequency output signals corresponding to each of the impedance sensors.

The system is further configured, such as through a programmed processing unit, to demodulate multiplexed signals to extract component output signals corresponding to individual impedance sensors using independent component analysis and/or by cross-correlating waveforms of a multiplexed signal with pre-defined template waveforms stored in a template library. The system further configured, such as through a programmed processing unit, to determine, from the demodulated component output signals, at least one of a particle size, particle speed, particle elasticity, particle location, and a particle dielectric property.

A method of particle analysis includes feeding a particle-laden flow through a plurality of microfluidic channels, each microfluidic channel having a corresponding dedicated impedance sensor that is adapted to output a signal representative of an impedance across the corresponding microfluidic channel, with each impedance sensor having a coded sequence of opposing positive and negative electrode fingers that is distinct from one another. In some examples the impedance sensors may be coded such that output signals from the plurality of impedance sensors are mutually orthogonal to one another.

Each of the microfluidic channels comprises an inlet end, an outlet end, and a micro-constriction portion positioned between the input and outlet end, and the dedicated impedance sensor corresponding to each microfluidic channel generates a signal representative of impedance at the micro-constriction portion of the corresponding microfluidic channel.

A signal generator provides a common excitation signal for driving the plurality of impedance sensors, the excitation signal being a multi-frequency signal comprising multiple tones such that the impedance sensors generate multi-frequency signals. The excitation signal may comprise two, three, four or more tones.

A single multi-frequency multiplexed signal is output that comprises each of the coded (e.g., mutually orthogonal) multi-frequency signals generated by the plurality of impedance sensors, and a lock-in amplifier separates the multi-frequency multiplexed signal into multiple multiplexed signals, with a separate multiplexed signal corresponding to each tone of the multi-frequency excitation signal. A programmed processing unit then demodulates the single-frequency multiplexed signals to extract single-frequency signals corresponding to each impedance sensor.

The programmed processing unit demodulates multiplexed signals to extract component output signals corresponding to individual impedance sensors using independent component analysis and/or cross-correlation between waveforms of a multiplexed signal with pre-defined template waveforms stored in a template library. The processing unit then determines, from the demodulated component output signals, at least one of a particle size, particle speed, particle elasticity, particle location, and a particle dielectric property.

The particle analysis performed may be immunophenotyping, with the particle-laden flow being a cell suspension and the micro-constriction portion of each microfluidic channels being dimensioned to limit flow therethrough to a particle-by-particle flow.

Both the foregoing general description and the following detailed description are exemplary and explanatory only and are intended to provide further explanation of the invention as claimed. The accompanying drawings are included to provide a further understanding of the invention; are incorporated in and constitute part of this specification; illustrate embodiments of the invention; and, together with the description, serve to explain the principles of the invention.

BRIEF DESCRIPTION OF THE DRAWINGS

Further features and advantages of the invention can be ascertained from the following detailed description that is provided in connection with the drawings described below:

FIG. 2a shows one example of a microfluidic sensor platform of the microfluidic system in FIG. 1, and FIG. 2b shows exemplary waveforms of individual sensors of the microfluidic sensor of FIG. 2a;

FIG. 3 shows one example of a Coulter sensor from the microfluidic sensor platform of FIG. 2a;

Figures 7A, 7B, 7C:
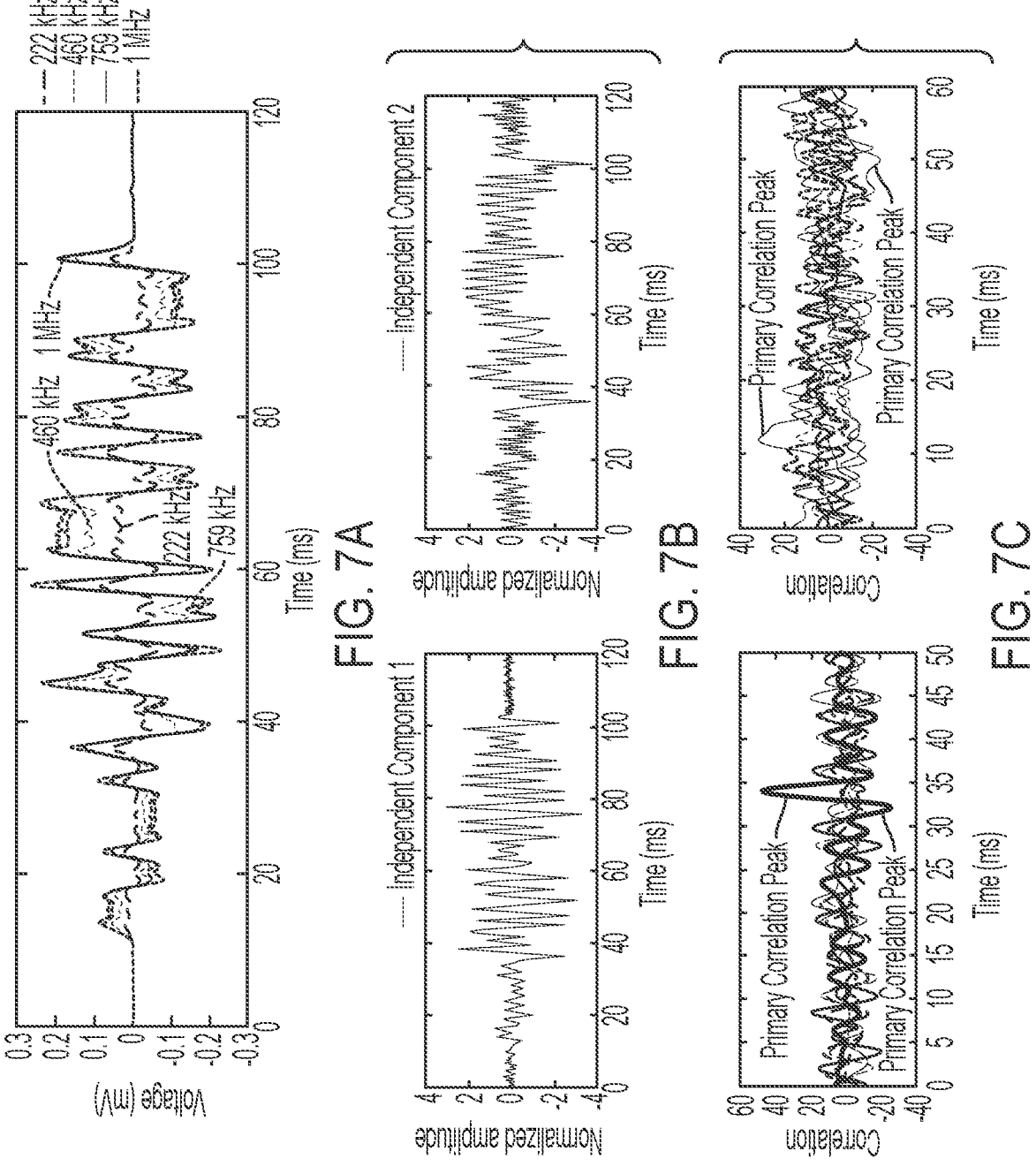
FIG. 7a shows one example of an interference signal resulting from a four-tone multi-frequency excitation signal.
FIG. 7b shows two interfering subcomponent signals extracted from the interference signal of FIG. 7a; and FIG.

7c shows primary correlations peaks in a cross-correlation analysis of the extracted component signals from FIG. 7b.

DETAILED DESCRIPTION OF THE INVENTION

The following disclosure discusses the present invention with reference to the examples shown in the accompanying drawings, though does not limit the invention to those examples.

The use of any and all examples, or exemplary language (e.g., "such as") provided herein is intended merely to better illuminate the invention and does not pose a limitation on the scope of the invention. No language in the specification should be construed as indicating any non-claimed element as essential or otherwise critical to the practice of the invention As used herein, unless the context clearly dictates otherwise, the singular forms "a," "an," and "the" include plural referents and the term "or" is to be understood as an inclusive "or." Terms such as "first", "second", "third", etc., when used to describe multiple devices or elements, are so used only to convey the relative actions, positioning and/or functions of the separate devices, and do not necessitate either a specific order for such devices or elements, or any specific quantity or ranking of such devices or elements.

The word "substantially", as used herein with respect to any property or circumstance, refers to a degree of deviation that is sufficiently small so as to not appreciably detract from the identified property or circumstance. The exact degree of deviation allowable in a given circumstance will depend on the specific context, as would be understood by one having ordinary skill in the art.

Use of the terms "about" or "approximately" are intended to describe values above and/or below a stated value or range, as would be understood by one having ordinary skill in the art in the respective context. In some instances, this may encompass values in a range of approximately +/−10%; in other instances there may be encompassed values in a range of approximately +/−5%; in yet other instances values in a range of approximately +/−2% may be encompassed; and in yet further instances, this may encompass values in a range of approximately +/−1%.

It will be understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof, unless indicated herein or otherwise clearly contradicted by context.

Recitations of a value range herein, unless indicated otherwise, serve as shorthand for referring individually to each separate value falling within the stated range, including the endpoints of the range, each separate value within the range, and all intermediate ranges subsumed by the overall range, with each incorporated into the specification as if individually recited herein.

Unless indicated otherwise, or clearly contradicted by context, methods described herein can be performed with the individual steps executed in any suitable order, including: the precise order disclosed, without any intermediate steps or with one or more further steps interposed between the disclosed steps; with the disclosed steps performed in an order other than the exact order disclosed; with one or more steps performed simultaneously; and with one or more disclosed steps omitted.

Figure 1:
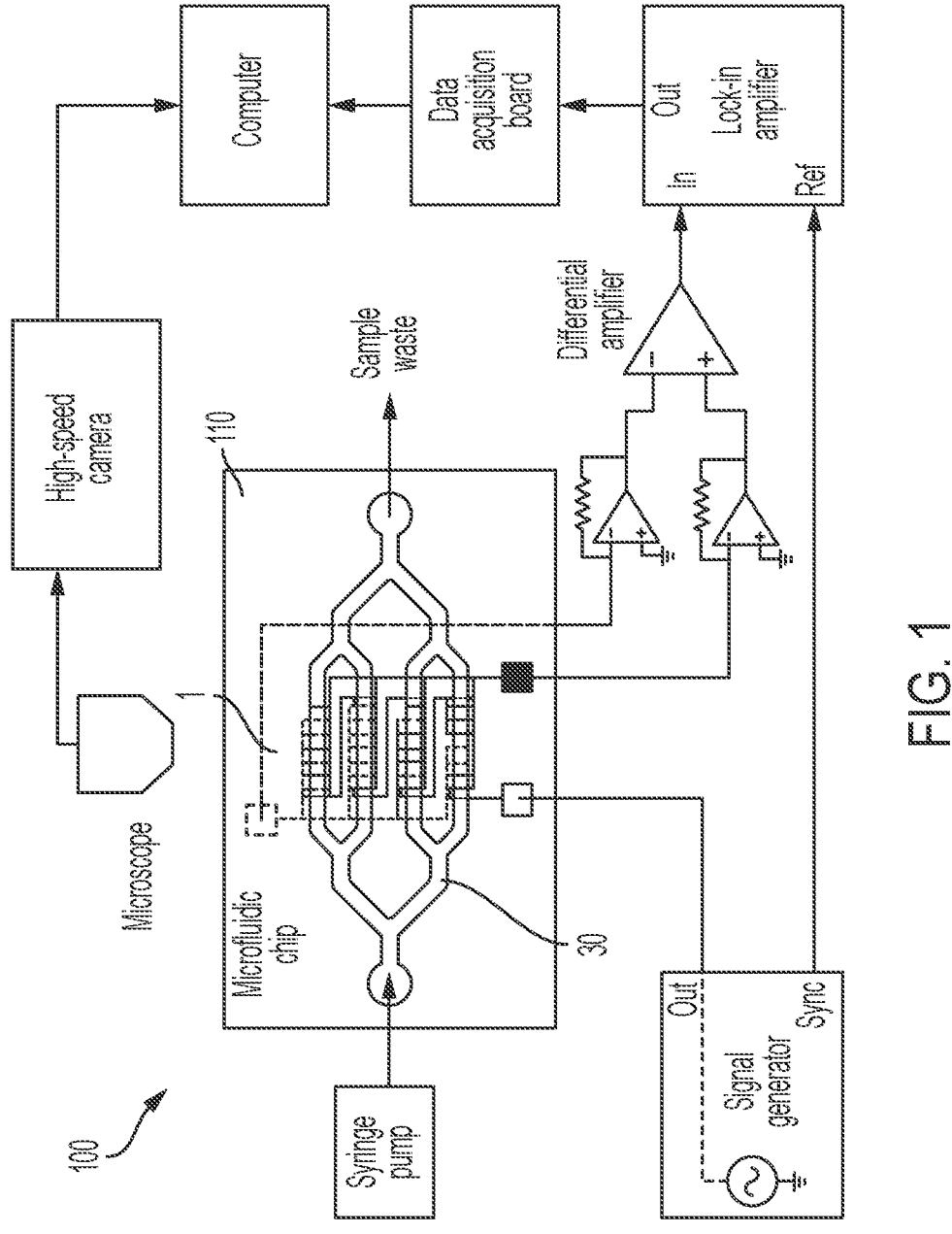
FIG. 1 shows one example of a microfluidic system according to the present invention.

FIG. 1 shows one example of a particle analysis system 100, such as an immunophenotyping system, that includes a microfluidic chip 110 having a sensor platform 1 designed for multiplexed detection of particles, such as cells. A particle suspension (e.g., a cell suspension) may be driven through the microfluidic chip 110 using a syringe pump for feeding the particle suspension into a common inlet, which then branches into multiple microfluidic channels 30 before entering the sensor platform 1. After passing through the sensor platform 1, the microfluidic channels 30 converge on a single outlet. An electrical signal (e.g., unipolar or bipolar) can be obtained using a differential amplifier, and may be sampled into a computing device for decoding. High-speed optical microscopy may then be used to validate the decoded electrical signal. An optical microscope, equipped with a high-speed camera, may optionally be provided such that recorded video footage may be used for providing visual analysis to assist in the monitoring of particle flow through the microfluidic chip 110.

In the system 100, the microfluidic channels 30, and in particular the portion thereof passing through the sensor platform 1, may be operatively coupled with one or more other components, including, but not limited to a power source, a signal generator, an amplifier, a transmitter, a receiver, a transceiver, a processor, a computer, a memory, a visual interface, a pump, and a sample reservoir. Specific configurations of the various components will be appreciated by one of ordinary skill in the art.

Figures 2A, 2B, 3:
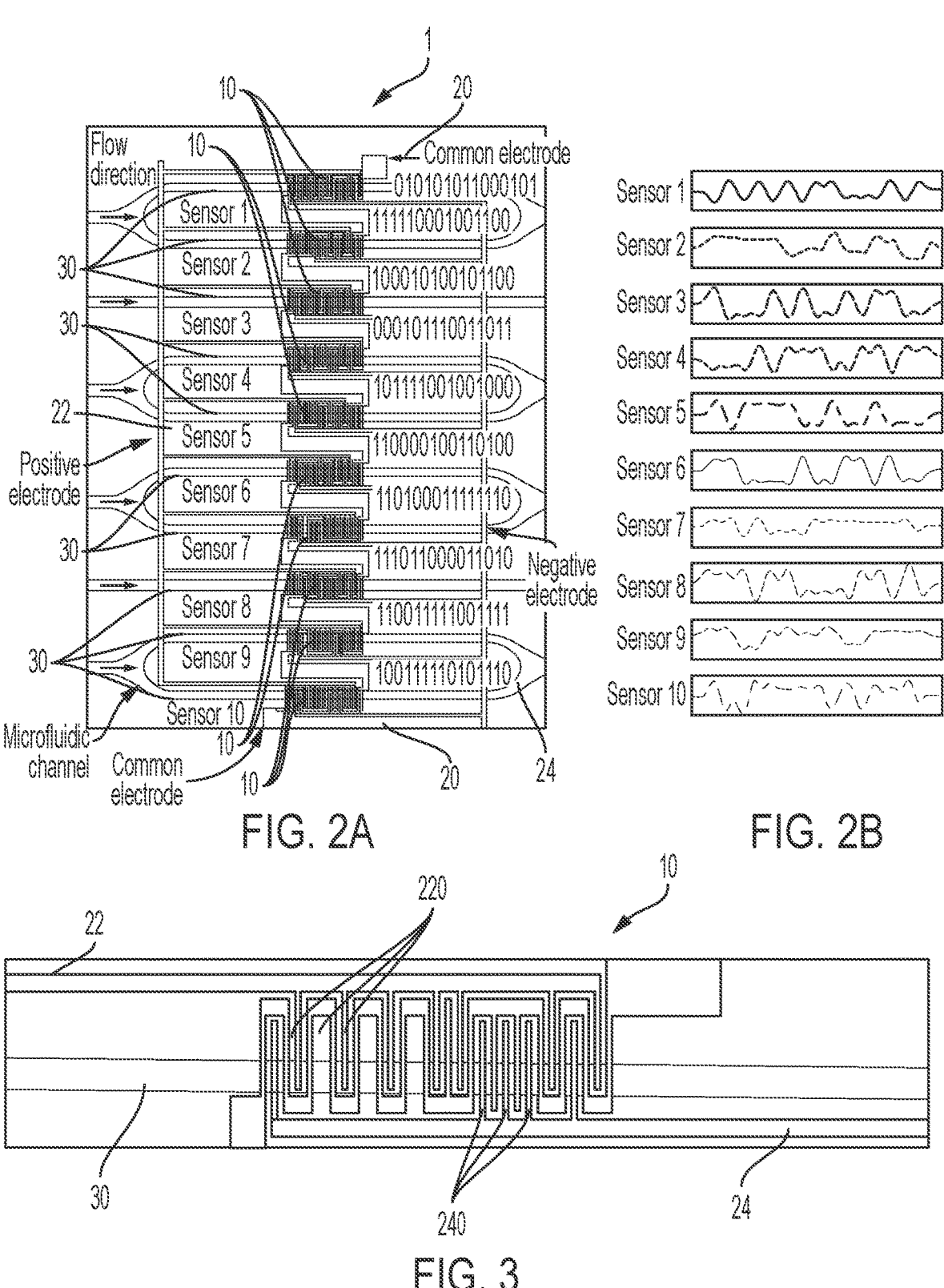

FIG. 2a shows one example of a microfluidic sensor platform 1, in the form of a 10-sensor multiplexed Coulter sensor platform. The sensor platform 1 is composed of two layers, a top polydimethylsiloxane (PDMS) microfluidic layer, and a bottom glass substrate layer with co-planar coding electrodes. The PDMS layer, which may be fabricated using soft lithography, has a number of microfluidic channels 30 for guiding a particle-laden flow. The glass substrate may be a 500 nm-thick Cr/Au film stack patterned using lift-off to create three electrodes, namely a common electrode 20, a positive electrode 22, and a negative electrode 24.

Interfacing surfaces of the positive and negative electrodes 22/24 define a number of individual Coulter sensors 10, with each sensor residing along an individual microfluidic channel 30. The Coulter sensors 10 may use Coded Orthogonal Detection by Electrical Sensing (CODES) technology, whereby each individual sensor is fabricated with a pair of opposing electrodes that have a distinct micro-pattern such that each Coulter sensor generates a unique output signal when a particle passes the electrodes. As shown in FIG. 3, the positive and negative electrodes 22/24 of a Coulter sensor 10 are composed of an interdigitated array of opposing positive and negative electrode fingers 220/240 of approximately 5 μm width, each separated by approximately 5 μm-wide gaps. The distinct signature of each Coulter sensor 10 is due to the unique spatial arrangement of the positive and negative electrode fingers 220/240, which confers a uniquely coded sequence to signals output from that sensor (e.g., a 31-bit digital sequence).

The Coulter sensor codes can be randomly generated. In some implementations the codes may be digital (e.g., composed of 1s and 0s), in other implementations the codes may be analog (e.g., analog shapes). As long as the pattern for each Coulter sensor 10 is different, the sensor platform 1 can be configured to differentiate between the individual signals generated by each separate sensor, thereby enabling code-multiplexing of the individual output signals from each sensor into a single electrical output signal. Coded Coulter sensors 10 are described in further detail in WO 2017/070602, published Apr. 27, 2017, titled "Electronic Sensors for Multiplexed Detection of Particles on Microfluidic Chips and Uses Thereof" FIG. 2b is illustrative of distinct signature waveforms that may be observed from multiple uniquely coded Coulter sensors 10.

In operation, a particle-laden flow is directed through the microfluidic channels 30 of the sensor platform 1 while an excitation signal is applied to the common electrode 20 for driving each of the Coulter sensors 10. A current flow is measured between the opposing positive and negative electrode fingers 220/240 of each Coulter sensor 10, and there is generated an output signal having a signature waveform based on the unique code sequence of that sensor. The sensor platform 1 combines the individual output signals from each Coulter sensor 10 into a single multiplexed output signal, and that multiplexed signal is subsequently decoded to extract and match the individual output signals with the respective sensor from which each was generated.

Figure 4:
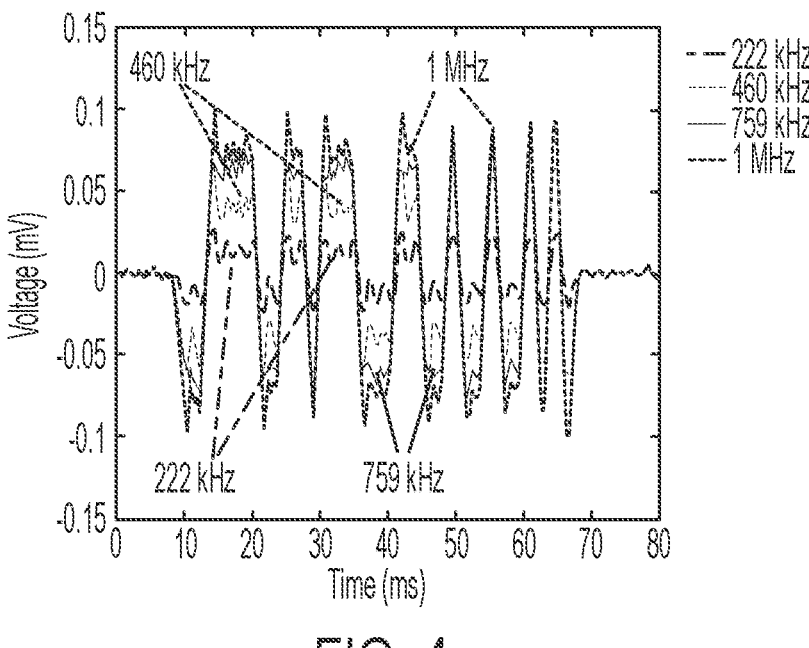
FIG. 4 shows one example of a frequency separated output signal of a single Coulter sensor driven by a multi-frequency excitation signal having four tones.
Figure 5:
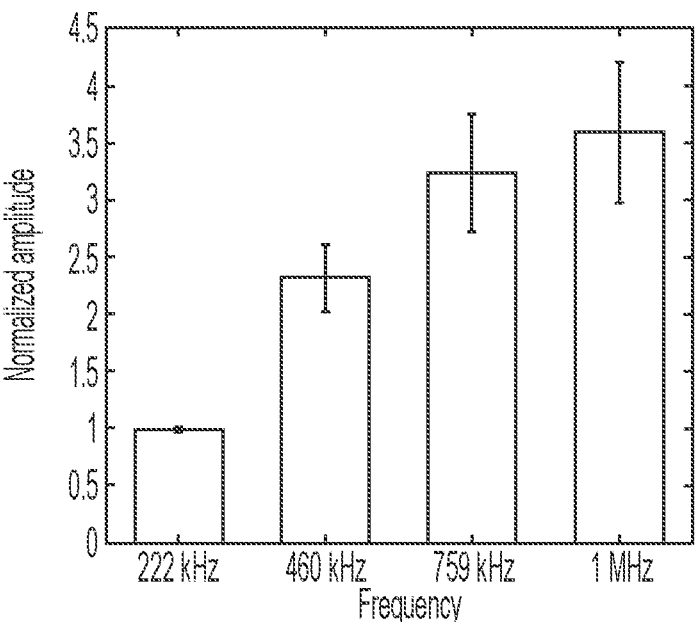
FIG. 5 shows one example of average amplitudes for multiple frequency signals, as generated from applying a multi-frequency signal for analysis of a cell population with the system of FIG. 1, with the average amplitude of signals in 222 kHz normalized to 1.

In one aspect of the present invention, the excitation signal applied to the common electrode 20, for driving each of the Coulter sensors 10, is a multi-frequency signal comprising two or more tones. FIG. 4 shows one example of a frequency separated output signal of a single Coulter sensor 10 driven by a multi-frequency excitation signal having four tones. In this example, a suspension of MDA-MB-231 human breast cancer cells in phosphate buffer saline (PBS) was driven through a single microfluidic channel 30 using a syringe pump while a lock-in amplifier (HF2LI with multi-frequency option) was used to excite the common electrode 20, and drive the Coulter sensor 10, with a multi-frequency signal that contained four tones (222 kHz, 460 kHz, 759 kHz, and 1 MHz) of equal amplitude. The output signal of the Coulter sensor 10 was recorded and decoded with four independent oscillators to extract the four separate frequency outputs. The output signal in FIG. 4 was encoded with a binary sequence of "00111100110-11100011001001001010". FIG. 5 shows an average amplitude of signals in each tone/frequency for the MDA-MB-231 cell population, as generated from measuring the signal amplitudes at different frequencies from 131 cells, with the peak signal amplitude at each frequency normalized to the peak signal amplitude recorded at 222 kHz.

In a system 100 according to the present invention, a multi-frequency signal is applied to the common electrode 20 for driving each of the Coulter sensors 10, and the sensor platform 1 outputs a multiplexed signal that combines the individual output signals from each sensor. As the individual output signal of each Coulter sensor 10 is a multi-frequency output, the multiplexed signal output from the sensor platform 1 is likewise a multi-frequency signal. The multiplexed signal is frequency demodulated to isolate waveforms of the multiplexed signal corresponding to the separate tones of the multi-frequency excitation signal. For example, where a four-tone multi-frequency excitation signal is applied to the common electrode 20, the system will isolate four separate waveforms, one corresponding to each of the four tones. Frequency demodulation and filtering may be done in any number of ways, including, for example, via a passive analog filter or a digital signal processing algorithm using a Fourier transform.

Following frequency demodulation, each frequency-specific isolated waveform of the multiplexed signal remains a multiplexed signal that combines the individual output signals from each of the Coulter sensors 10, at the corresponding frequency. Each of the isolated waveforms is then decoded to extract and match each individual output signal to the corresponding Coulter sensor 10 from which each was generated. Decoding of the isolated waveforms may be achieved, for example, through cross-correlation of the multiplexed waveforms with a pre-defined template library that stores exemplary waveforms corresponding to each Coulter sensor 10.

A template library may be defined in advance by generating a number of exemplary output signal waveforms that correspond to the unique signature of each respective Coulter sensor 10, based on the distinct pattern of the electrode fingers 220/240. The exemplary signal waveforms are then stored in a template library as sensor template waveforms. Owing to the unique signature of the output signals generated by each Coulter sensor 10, and through cross-correlation with the pre-stored sensor template waveforms, the multiplex waveforms may be decoded to identify and extract the individual output signals corresponding to the respective Coulter sensors 10.

The template library may include waveforms based on measured and normalized code signals, such as that illustrated in FIG. 5, as well as computer-generated variations having alternate durations to accommodate differences in flow speed between different particles. By cross-correlating a multiplexed signal with the pre-stored templates, there may be identified a specific template that is found to present a primary peak correlation with a component output signal of the multiplexed signal, and that template waveform may then be used to identify: (1) the specific microfluidic channel 30 that a particle passed through; and (2) the digital code signal duration, and hence the transit time for that particle. Correlation with a template waveform is assessed based on the unique digital codes provided to each Coulter sensor 10. For example, the Coulter sensors 10 may be coded so as to be orthogonal to one another.

Though the separate Coulter sensors 10 are each given a unique code sequence (e.g., mutually orthogonal signals), there remains a possibility for interference between signals of two sensors, for example, upon a coincidental detection of particles. In such instances, the output signals from two Coulter sensors 10 may interfere in a manner to partially complement and/or cancel one another, thereby complicating cross-correlation of the multiplexed signal with the sensor waveform templates. This impedes the ready identification of individual output signals, and the association of such signals with the corresponding Coulter sensors 10. This is of particular concern for processing samples with high particle density, where particles are more likely to overlap.

Interference signals that result from two interfering component signals may be processed to discriminate between the separate component signals through a recursive approach, whereby individual component signals are extracted from the interference signal one-by-one by successively cross-correlating the interference signal waveform with pre-stored sensor template waveforms to estimate and isolate the individual component signals. Such a recursive approach may be performed by beginning with a signal waveform that is observed to have a primary correlation peak with a template waveform. When a sensor template waveform is found to present a primary peak correlation based on the distinctly coded (e.g., mutually orthogonal) waveforms, that waveform is then subtracted from the interference waveform. The residual interference waveform may then again be correlated with the sensor template waveforms for identifying a next primary correlation peak, with the process repeating until no sensor template waveform can be matched to the residual interference waveform. Recursive discrimination of interference signals is discussed in further detail in WO 2017/070602.

Alternatively or in addition, interference signals may also be processed to discriminate the component signals thereof through further use of a waveform library that stores pre-defined interfering template waveforms. Interference template waveforms may be generated in advance by combining variations of non-interfering signal waveforms, as generated by the uniquely coded Coulter sensors 10, and storing the combined waveforms as exemplary interference template waveforms. The template library may include interference signals that result from several permutations and variations of non-interference signal combinations. As the interference template waveforms are generated from pre-defined combinations of non-interfering waveforms, an interference waveform that is found correlate with an interfering template waveform may be decoded into separate component waveforms based on the unique code sequences of the respective Coulter sensors 10 from which the non-interfering template waveforms were generated.

Figure 6:
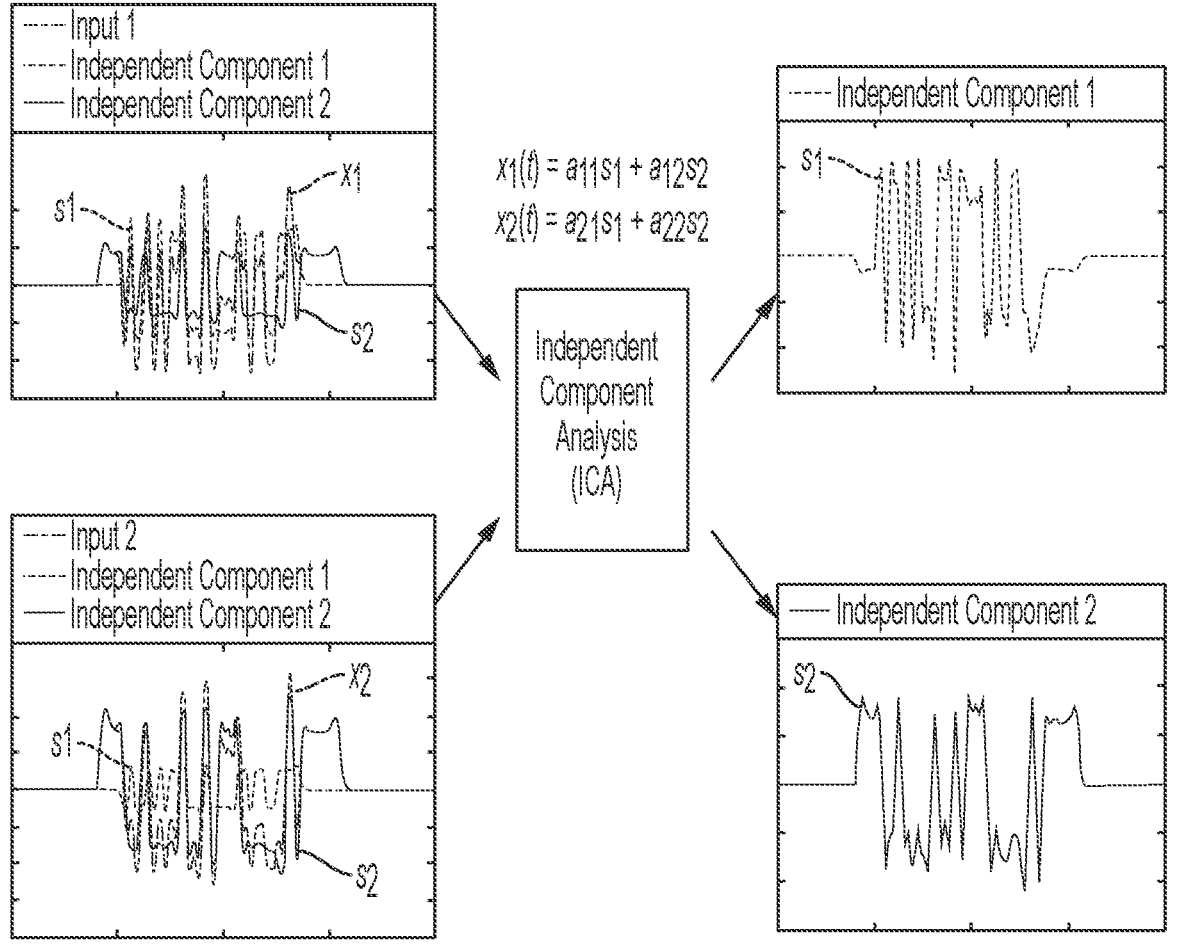
FIG. 6 shows one example of using independent component analysis to solve two multivariate signals that are linear combinations of two separate source signals, as may be performed with the system of FIG. 1.

In another aspect of the present invention, decoding of the multiplex signal, and resolution of interference signals, is facilitated via a blind signal separation (BSS) algorithm, such as independent component analysis (ICA). ICA is a mathematical method for separating a multivariate signal into additive components based on an initial assumption that the multivariate signal is a linear combination of components that are statistically independent. FIG. 6 illustrates an example of two multivariate signals ($x_1$ and $x_2$, left side) that are linear combinations of two separate source signals ($s_1$ and $s_2$, right side), with different coefficients ($a_{11}$, $a_{12}$ and $a_{21}$, $a_{22}$). Using ICA, the separate source signals can be identified and extracted from the multivariate signals without prior knowledge of either source signal.

In a multi-frequency implementation according to the present invention, when output signals from multiple sensors interfere due to coincident particle detections, the resulting interference signal at each drive frequency is a multivariate signal. As such, multivariate interference signals at different frequencies may be treated as two independent linear combinations (e.g., $x_1$ and $x_2$) of multiple separate component source signals (e.g., $s_1$ and $s_2$), with different coefficients (e.g., $a_{11}$, $a_{12}$ and $a_{21}$, $a_{22}$) based on the different dielectric properties of the separately detected particles. Though the foregoing discussion addresses an ICA, those of ordinary skill in the art will appreciate that other suitable BSS algorithms may be used, such as, though not limited to, singular value decomposition, principal component analysis, non-negative matrix factorization, stationary subspace analysis, and the like.

FIG. 7a shows one example of an interference signal that is the result of two-component output signals from different Coulter sensors 10 that were both driven by a common multi-frequency excitation signal having four tones (222 kHz, 460 kHz, 759 kHz, and 1 MHz). The interference signal was analyzed using ICA and separated into two subcomponent signals, corresponding to the waveforms shown in FIG. 7b. The two sub-waveforms were matched to the respective Coulter sensors 10 from which each was generated by cross-correlation with sensor template waveforms from the template library to identify maximum correlation peaks, as shown in FIG. 7c.

Once the individual output signals are identified and matched with the corresponding Coulter sensors 10 from which they were generated, the signals may then be used to measure the size, speed, elasticity, and location of particles passing through the microfluidic channels. In addition, due to the use of a multi-frequency excitation signal, and the generation of multiple output signals at varying frequencies, there can be obtained more complex impedance measurements that further inform the dielectric properties of individual particles.

By enabling the tracking and manipulation of particles, as well as the identification of specific particle properties and characteristics, it is expected that systems according to the present invention may promote improvements to particle studies, such as enhanced particle classification and condition prediction, which may in turn promote more efficient particle tracking and analysis systems (e.g., particle analyzers, cytometers, etc.). A system according to the present invention may integrate a microfluidic sensor platform with a device that differentially manipulates particles in a particle-laden flow for fractionating the microfluidic particle flow based on pre-defined criteria. That is, data obtained from the sensor platform may be used to quantify the expression of one or more particle characteristics, and then to sort the particles into separate populations based thereon. For example, such a system may monitor a flow of tumor cells to quantify expression of one or more target proteins having predetermined clinical utility, and may sort the cells based on expression of the target proteins to create distinct cell populations for use in clinical studies and/or therapies.

Although the present invention is described with reference to particular embodiments, it will be understood to those skilled in the art that the foregoing disclosure addresses exemplary embodiments only; that the scope of the invention is not limited to the disclosed embodiments; and that the scope of the invention may encompass additional embodiments embracing various changes and modifications relative to the examples disclosed herein without departing from the scope of the invention as defined in the appended claims and equivalents thereto. For example, though the foregoing disclosure addresses examples in which Coulter impedance sensors generate mutually orthogonal signals, via an arrangement of common, positive and negative electrodes with an interdigitated array of positive and negative electrode fingers, the impedance sensors may instead generate unipolar and non-orthogonal signals, via an arrangement of a common and positive electrode with an array of positive and common electrode fingers.

To the extent necessary to understand or complete the disclosure of the present invention, all publications, patents, and patent applications mentioned herein are expressly incorporated by reference herein to the same extent as though each were individually so incorporated. No license, express or implied, is granted to any patent incorporated herein.

Although specific embodiments have been illustrated and described herein, those of ordinary skill in the art appreciate that any arrangement which is calculated to achieve the same purpose may be substituted for the specific embodiments shown and that the embodiments herein have other applications in other environments. This application is intended to cover any adaptations or variations of the present disclosure. The following claims are in no way intended to limit the scope of the disclosure to the specific embodiments described herein.

The present invention is not limited to the exemplary embodiments illustrated herein, but is instead characterized by the appended claims.

What is claimed is:

1. A microfluidic device for particle analysis, comprising:
a plurality of microfluidic channels for the passage of a particle-laden fluid flow;
a plurality of impedance sensors, each of the plurality of impedance sensors being dedicated to a single microfluidic channel for outputting a signal representative of an impedance across the corresponding microfluidic channel, each of the plurality of impedance sensors comprising a coded sequence of opposing electrode fingers, the coded sequences of the impedance sensors being distinct from one another; and
a signal generator in signal communication with the impedance sensors for driving the impedance sensors with an excitation signal, the signal generator being configured to output a multi-frequency excitation signal comprising multiple concurrent tones to each impedance sensor, wherein
the impedance sensors are configured in signal communication with the signal generator such that each impedance sensor is driven by the multi-frequency excitation signal with the multiple concurrent tones to generate a multi-frequency signal representative of impedance across the corresponding microfluidic channel, and to output the multi-frequency signals of the plurality of impedance sensors as a single multi-frequency multiplexed signal that comprises each of the multi-frequency signals generated by the individual impedance sensors, and
the microfluidic device further comprises:
first circuitry programmed to separate the multi-frequency multiplexed signal into multiple single-frequency multiplexed signals, with a separate single-frequency multiplexed signal corresponding to each tone of the multi-frequency excitation signal, and
second circuitry programmed to separate each of the single-frequency multiplexed signals to extract single-frequency output signals corresponding to each of the impedance sensors.

2. The microfluidic device according to claim 1, wherein the signal generator is configured to output a multi-frequency excitation signal comprising two or more tones, such that each impedance sensor generates a multi-frequency signal representative of an impedance across the corresponding microfluidic channel, the multi-frequency signal generated by each impedance sensor comprising a corresponding number of tones as the excitation signal.

3. The microfluidic device according to claim 1, wherein the first circuitry is a lock-in amplifier programmed to receive the multi-frequency multiplexed output signal from the sensor platform, and to separate the multi-frequency multiplexed signal into multiple single-frequency multiplexed signals, with a separate single-frequency multiplexed signal corresponding to each tone of the multi-frequency excitation signal.

4. The microfluidic device according to claim 1, wherein the second circuitry is a processing unit programmed to receive separated single-frequency multiplexed signals from the first circuitry, and to separate each of the single-frequency multiplexed signals to extract single-frequency output signals corresponding to each of the impedance sensors.

5. The microfluidic device according to claim 4, wherein the processing unit is further programmed to separate single-frequency multiplexed signals to extract component output signals corresponding to individual impedance sensors using a blind signal separation algorithm.

6. The microfluidic device according to claim 4, wherein the processing unit is further programmed to separate single-frequency multiplexed signals to extract component output signals corresponding to individual impedance sensors by cross-correlating waveforms of a single-frequency multiplexed signal with pre-defined template waveforms stored in a template library.

7. The microfluidic device according to claim 1, wherein the second circuitry is further configured to determine, from the separated component output signals, at least one of a particle size, particle speed, particle elasticity, particle location, and a particle dielectric property.

8. The microfluidic device according to claim 1, wherein each of the microfluidic channels comprises an inlet end, an outlet end, and a micro-constriction portion positioned between the input and outlet end, and for each microfluidic channel, the corresponding dedicated impedance sensor is configured to generate a signal representative of impedance at the micro-constriction portion of the corresponding microfluidic channel.

9. The microfluidic device according to claim 8, wherein the micro-constriction portion of each microfluidic channel is dimensioned to limit flow therethrough to a particle-by-particle flow.

* * * * *